(12) United States Patent
Rumiantsev et al.

(10) Patent No.: US 7,999,563 B2
(45) Date of Patent: Aug. 16, 2011

(54) CHUCK FOR SUPPORTING AND RETAINING A TEST SUBSTRATE AND A CALIBRATION SUBSTRATE

(75) Inventors: Andrej Rumiantsev, Dresden (DE); Stojan Kanev, Thiendorf OT Sacka (DE); Steffen Scott, Dresden (DE); Karsten Stoll, Sohland an der Spree (DE)

(73) Assignee: Cascade Microtech, Inc., Beaverton, OH (US)

( * ) Notice: Subject to any disclaimer, the term of this patent is extended or adjusted under 35 U.S.C. 154(b) by 245 days.

(21) Appl. No.: 12/489,913

(22) Filed: Jun. 23, 2009

(65) Prior Publication Data

US 2009/0315581 A1     Dec. 24, 2009

(51) Int. Cl.
*G01R 31/00* (2006.01)
(52) U.S. Cl. .......... 324/750.03; 324/750.01; 324/750.02
(58) Field of Classification Search ............... 324/750.03
See application file for complete search history.

(56) References Cited

U.S. PATENT DOCUMENTS

| | | | | |
|---|---|---|---|---|
| 5,414,370 A * | 5/1995 | Hashinaga et al. | ...... | 324/750.07 |
| 5,963,027 A * | 10/1999 | Peters | ...... | 324/750.14 |
| 6,468,098 B1 * | 10/2002 | Eldridge | ...... | 439/197 |
| 6,825,681 B2 * | 11/2004 | Feder et al. | ...... | 324/750.07 |
| 7,038,441 B2 * | 5/2006 | Stoll et al. | ...... | 324/757.01 |
| 7,187,188 B2 * | 3/2007 | Andrews et al. | ...... | 324/750.03 |
| 7,518,358 B2 * | 4/2009 | Dunklee | ...... | 324/756.07 |
| 2003/0071631 A1 * | 4/2003 | Alexander | ...... | 324/500 |
| 2008/0007285 A1 * | 1/2008 | Nakase et al. | ...... | 324/765 |

* cited by examiner

*Primary Examiner* — Vinh P Nguyen
*Assistant Examiner* — Joshua Benitez
(74) *Attorney, Agent, or Firm* — Chernoff, Vilhauer, McClung & Stenzel

(57) ABSTRACT

A chuck for supporting and retaining a test substrate includes a device for supporting and retaining a calibration substrate. The chuck comprises a first support surface for supporting a test substrate and a second support surface, which is laterally offset to the first support surface, for supporting a calibration substrate The calibration substrate has planar calibration standards for calibration of a measuring unit of a prober, and dielectric material or air situated below the calibration substrate at least in the area of the calibration standard. In order to be able to take the actual thermal conditions on the test substrate and in particular also on known and unknown calibration standards and thus the thermal influence on the electrical behavior of the calibration standard used into consideration, the second support surface is equipped for temperature control of the calibration substrate.

19 Claims, 6 Drawing Sheets

CHUCK FOR SUPPORTING AND RETAINING A TEST SUBSTRATE AND A CALIBRATION SUBSTRATE

CROSS REFERENCE TO RELATED APPLICATIONS

This application claims priority of German application No. 10 2008 029 646.5-35 filed on Jun. 24, 2008, the entire disclosure of this application being hereby incorporated herein by reference.

TECHNICAL BACKGROUND

The invention relates in general to probers, which are used to ascertain electrical properties of electronic components, referred to hereafter as test substrates in general. The invention particularly relates to a chuck which is used to support and retain a test substrate and, in addition, a calibration substrate. The chuck comprises a first support surface for supporting a test substrate and a second support surface, which is laterally offset to the first support surface, for supporting a calibration substrate, dielectric material or air being situated below the calibration substrate at least in the area of the calibration standard, and the calibration substrate having planar calibration standards for calibrating a measuring unit of the prober.

PRIOR ART

Chucks are special retaining devices suitable for supporting and retaining test substrates and calibration substrates, which comprise one or more level support surfaces for the direct support or the indirect support, which is implemented by retaining means, of the various cited substrates. A chuck may also comprise a positioning unit, which is used to move the support surface, in addition to further components. It is part of a checking station, a so-called prober, which is used for checking and testing the electronic components.

In addition, a prober has probe tips, which are retained by a probe mount and to which the support surface and thus a substrate situated thereon may be fed in order to produce an electrical contact between a substrate and the probe tips, it possibly being necessary in the course of a measuring sequence to change between contacting test substrate and contacting calibration substrate. Furthermore, a prober comprises a monitoring unit for controlling the measuring sequence, for monitoring and regulating the measuring conditions, for storing ascertained or needed data in a databank, and/or further tasks. Because temperature-dependent measurements may also be performed in a greater temperature range, temperature-control devices are frequently integrated, which are used to heat or cool the test substrate. Probers typically also have a shielding housing for setting a measuring atmosphere which deviates from the surroundings and/or for delimiting parasitic electromagnetic influences.

To measure a test or calibration substrate, suitable measuring points on the substrate are contacted using probe tips, electrical signals are supplied and/or tapped, and the physical properties, in particular the electrical properties, of the contacted components are ascertained using these or further signals, such as optical or mechanical signals.

In this way, greatly varying electronic components are checked and characterized, also optical or micromechanical components or other components which are provided in various production stages. Thus, both a plurality of components, which are provided still in the wafer composite or also isolated, and are partially or completely finished, are subjected in the probers to various checks and tests under various environmental and measuring conditions. In general, these various check or test objects are referred to as a device under test or also as a test substrate, the latter being differentiated from the carrier substrate, on which a component may be situated.

Very different requirements are placed on the checking devices depending on the electronic component to be measured and in particular depending on the frequency range relevant for the component, i.e., the high-frequency or low-frequency range.

In the high-frequency (HF) range, whose lower limit is continuously shifting toward higher frequencies with the development of electronic components and which is currently at frequencies from approximately 6 GHz, the checking device comprises a vectorial network analyzer (VNA) as a measuring unit. Vectorial network analyzers are used for the precise measurements of various electronic parts and components and active and passive high-frequency circuits and high-frequency assemblies up to antennas.

In the network analyzers, the scattering parameters (also called S parameters) of the test substrates are ascertained, which are the typical form of description of the electronic behavior of electronic parts and components in the high-frequency range. This form of description does not link currents and voltages to one another, but rather wave frequencies, which are particularly adapted to the physical conditions. A so-called system error correction ensures that precise measurements of the scattering parameters of the parts and components may be performed at all using vectorial network analyzers. This system error correction presumes a precise calibration measurement of standards, whose electronic behavior is known or is determinable in the scope of the system error correction.

In the LF range, in which signals down to the range of 3 GHz, currently at most 6 GHz, are used with increasing scaling of the components and as power consumption becomes less, measuring methods are used which are based on measurements of capacitances, voltages, and inductions in this frequency range. Thus, to characterize electronic components, for example, their current-voltage characteristic curve is ascertained using pulse I/V measurement or capacitance-voltage characteristic curve (CV measurements) to determine charge carrier profiles.

In these measurements, significantly lower-power measuring signals are used than for the measurements which were typical a few years ago, because even a low power may result in destruction of the component or in unusable measured values. Thus, pulsed resistance and pulsed I/V measurements are performed using pulses of only 50 µs, even with low currents, because short pulses mean that less power is absorbed by the electronic component. The ascertainment of the low-frequency noise behavior (low-frequency noise—LFN), e.g., using 1/f measurement, is also used for characterizing the components and is performed with extremely small measuring signals in the above-mentioned frequency band. Various devices known for the particular measurement may be used here as the measuring unit of a prober.

Thus, to measure calibration standards and test substrates, for example, so-called source monitor units (SMUs), also referred to as source measurement units, may be used, which may be programmable. An SMU is a precise power supply unit, which ensures voltage supply and measurement at a resolution of 1 mV or less and current supply and measurement at a resolution of 1 µA or less. It may also be combined with a vectorial network analyzer in a prober. Thus, in a checking configuration which has a vectorial network analyzer, a running precise resistance measurement is possible using a supplementary SMU, and calibrations and measurements of test substrates may be performed over the entire frequency range and the temperature range of interest using a prober, if the HF and LF calibration standards are provided jointly on the chuck.

The type of the usable calibration standard is a function in particular of the measuring method. For example, for CV measurements, impedances having various terminations, a wave termination of 50Ω, or similar to a short circuit or idle are used. In addition, a low-loss capacitor is used. The latter may be formed by a long coplanar waveguide, for example, or have more complex structures, such as two opposing comb structures, in order to achieve a higher precision in the set capacitance of the calibration standard.

Various resistors are needed as calibration standards for the I/V measurements. For the calibration for LFN measurements, calibration standards such as the impedances described above for the CV measurement or standards or thin-film resistors known from the ascertainment of the scattering parameters of electronic components are frequently used.

On the one hand, the measuring environment, such as the substrate on which a calibration standard and a component are implemented, the design of the components, the specific materials used of the metallizations on the wafer, and other factors have a significant influence on the calibration method. For the calibration of measuring units of probers, in particular for measurements in the wafer composite, the so-called on-wafer measurements, calibration standards have proven to be expedient which are implemented in planar, e.g., coplanar line technology on a calibration substrate.

Both a separate carrier substrate, which may comprise various materials, and also a wafer having electronic components on which one or more calibration standards are implemented, are to be understood as a calibration substrate hereafter.

In general, various designs of the configuration of ground and signal lines are described as planar lines. One design of planar lines is the coplanar lines. The ground and signal lines are in the plane therein. In contrast, in so-called micro-strip or mixed configurations, the ground and signal lines lie one above another in two planes, which are electrically insulated from one another.

The electronic properties of the calibration standards are favorably known, in order to be able to perform the calibration of the measuring configuration. Otherwise, the unknown standards must be ascertained by computer, which requires significantly greater measuring and computing effort and is only possible under defined constellations of various known and unknown standards. The known or ascertained electrical properties of the calibration standard are linked, however, to the particular measuring environment, in particular to the temperature at which the measurement was performed, and to the substrate, on which the standard is implemented. Changes in the measuring environment cause changes of the electrical properties to an unknown extent.

In order to reduce the influence of the typically metal support plate of the chuck on the calibration standard, which is no longer negligible at higher frequencies in the gigahertz range in particular, a spacing is set between the calibration substrate and the support plate in DE 196 39 515 A1, which is filled with air or another dielectric fluid. It is to be ensured by the dielectric intermediate layer that with the coplanar calibration standards which are typically used in HF technology, a pure and well calculable coplanar line type is implemented. This is because experiments have shown that at higher frequencies along the coplanar lines of the calibration standard, as a result of a metal support plate, the field distribution changes from that of a coplanar line type to the field distribution of a micro-strip line. This effect, which is known as the quasi-micro-strip mode, causes a change of the electrical properties of the calibration standard and thus errors in the system error correction of the network analyzer. However, it has been shown that using a nonmetal support plate for the calibration substrate or interposing a special absorber, which reduces the quasi-micro-strip mode, also does not reduce the loss over the line of a calibration standard to the required extent.

On the other hand, it is frequently necessary for the characterization of the test substrates to set the climatic conditions, which are sometimes also extreme, under which the components are later used. For this purpose, in differently designed checking stations, the electronic components are set to a measuring temperature, which deviates from room temperature, by thermal contact with a temperature-controllable chuck (DE 10 2005 015 334 A1) or by a temperature-controlled fluid flow (DE 10 2006 038 457 A1, DE 10 2006 015 365 A1), which is directed onto the component.

In order to be able to perform a calibration, current calibration measurements are performed using calibration standards which are exclusively measured at room temperature, in order to ensure the precision of the calibration measurements. For this purpose, it is necessary to thermally decouple the calibration standards from the component, which is to be measured in direct chronological and spatial relationship (J. E. Pence, R. Anholt "Calibration and measurement considerations for deriving accurate temperature dependent equivalent circuits" ARFTG Microwave Measurements Conference-Spring, 41st, 1993, pp. 85-92). Calibration standards whose electrical behavior is known may thus be used, but a consideration of the actual thermal conditions on the test substrate is not possible.

In addition, thermal decoupling of the test substrate and the calibration substrate may not be ensured, inter alia, because of the sequential contacting by the same probe tips. Thus, each probe tip, which is initially in mechanical contact and thus also thermal contact with a hot test substrate at 200° C., for example, and then contacts a calibration standard, acts as a heat transmitter between the two substrates.

BRIEF DESCRIPTION OF THE INVENTION

It is proposed, contrary to the methods up to this point, that the test substrate and the calibration substrate be thermally linked to one another using the chuck described hereafter, so that the thermal influence of the measuring conditions under which the test substrate is measured on the electrical behavior of known and unknown calibration standards is taken into consideration. This is performed both for separate calibration substrates and also for calibration standards which are implemented on the same electrical system on which the components to be measured are also provided.

The setting of the temperature of the calibration substrate using the support surface which supports the calibration substrate to a defined temperature allows the climatic conditions of test substrate and calibration substrate to be adapted to one another and the changes of the electrical properties of the calibration standard linked thereto thus to be incorporated into the calibration method. As a result of the equalization of the thermal conditions of test substrate and calibration substrate, influencing by the probe tips is also to be avoided, which would act as a heat carrier between component and calibration standard to a non-negligible extent in the known, thermally decoupled method.

As a result of the temperature control, i.e., heating or cooling of the calibration substrate to a defined temperature, typically that of the test substrate, via the support surface, the changes of the measuring system which accompany a temperature change and which increase at higher frequencies, in particular also the electrical and magnetic properties of the dielectric calibration substrates, are taken into consideration. This is because these properties have a direct influence on the electrical length of a calibration standard implemented thereon.

The setting of the temperature of the support surface for the calibration substrate may be performed in various ways. Tracking of the temperature via thermal coupling of two separate support plates which form the two support surfaces using heat conductors is possible, as is the implementation of first and second support surfaces in a shared, one-piece support plate. The design of the chuck which is used is a function, for example, of the temperature control device of the first support surface, which supports the test substrate, and the temperature range of the measurement. The heat conduction properties of the material of the first support plate forming the first support surface, which are in turn a function of the electrical and magnetic properties to be set in a relevant frequency range, are also to be taken into consideration for the design of the thermal coupling.

Thus, the use of heat conductors allows the use of different materials for both support plates which form the support surfaces, connectors between the two support plates having heat conduction properties for the relevant temperature range, such that an equalization of the temperature is producible within a specific time, being understood as heat conductors. In this case, in addition to the materials used, the mass conditions of both support plates are also again to be taken into consideration. In general, it is necessary for the first support plate, which supports the test substrate, to be thermally stable, i.e., the temperature change in the course of a measuring sequence to be less than or equal to 0.5%, for example. A second support plate which is relatively large in comparison to the first support plate would be contrary to this requirement or long waiting times would be necessary until setting of the thermal equilibrium.

Because, in addition to carbon, metals are good heat conductors, a design having metal support plates or connectors is oriented in particular to applications having those frequencies at which the influence of the metal support plates or support plates containing metal parts on the electrical behavior is slight. Alternatively, a more special, e.g., multilayered construction of the support plate is also possible, in connection with a measuring regime which allows the setting of the desired thermal equilibrium between the two plates.

In a further alternative design, separate devices for setting the temperature of both support surfaces are integrated. In this design, the heat conduction loses significance, so that other materials which conduct heat less well may also be used, for example, if the one or two support plates are permeated by a heating or cooling agent. Using separate devices for heating or cooling the support plates, separate temperature regimes of the two support plates may additionally be followed, for which regulators adapted to one another may be used.

Because of the very precisely settable thermal and dielectric properties, ceramic materials may be used for the various described designs and either for the shared support plate or the first and/or the second support plate.

Furthermore, the thermal coupling includes the feature that those designs may be used for one or both support plates in which a recess is situated at least below the calibration substrate. This recess may be filled using a dielectric material, e.g., also a ceramic or another suitable material, or may remain empty and form an air chamber below the particular substrate. In both cases, a minimization of the influence of the support plate on the calibration and possibly also the measurement of the test substrate is achieved. A comparable effect is reached by a second support plate, which is situated in a recess of the first support plate, the second support plate also being able to fill up the recess completely or only delimit it on top here. The latter embodiment may be used, for example, if the stability of the calibration substrate is to be improved by the second support plate.

If an air chamber remains in one or possibly in two recesses, it may be permeated by a suitable cooling or heating fluid for the temperature control of the calibration substrate and/or the test substrate. The support plates may be adapted to various applications in regard to the electrical and thermal requirements using the selection of the material of a liquid or gaseous fluid and also using the design of the air chamber having fluid inflow and fluid outflow and thus using the permeation of the air chamber. Thus, in various designs a flow may occur along or in the direction of the back side of a substrate or a flow directed toward the calibration substrate may be avoided, e.g., in that the fluid inflow and outflow occur at a distance from and without directional component toward the calibration substrate or in that the air chamber is closed using a thin dielectric material.

In one design of the invention, the calibration substrate is retained using suitable retention means above the air chamber, which is open toward the calibration substrate, so that the fluid presses directly against the calibration substrate.

Using a fluid flowing through the air chamber, both with an air chamber closed toward the substrate and also with an open air chamber, the measuring temperature of the substrate and thus of the calibration standard and of the electronic component is settable reproducibly and very rapidly, because the heat exchange is to be defined and regulated very well via the selection of the fluid, via its flow temperature, i.e., the difference between the temperature of the fluid and the temperature of the component to be set, and via the rapidly controllable parameters of flow velocity and action time. On the other hand, it is possible to implement a good heat exchange between the fluid and the calibration substrate through a defined flow direction and velocity. The required setting time is also to be reduced, because essentially only the calibration substrate is temperature controlled.

In addition to the measuring task, which may also provide active cooling during measurement, for example, the selection of the fluid is a function of the component, the supply and tapping of the signals, and the further measuring environment. Thus, in many applications air is used because of its simple handling. However, liquid is also usable if the electrical contacts are spatially separate from the fluid flow. The liquid has the advantage that it has a higher heat capacity, whereby smaller fluid quantities are required for the same temperature differential.

BRIEF DESCRIPTION OF THE FIGURES

The invention is to be explained in greater detail hereafter on the basis of exemplary embodiments. In the figures of the associated drawings.

The embodiments shown in the drawings are to be an exemplary and in no way restrictive illustration of the invention. Insofar as corresponding structural components are shown in the various figures, they are identified using identical reference numerals.

DETAILED DESCRIPTION OF THE INVENTION

Figure 1:
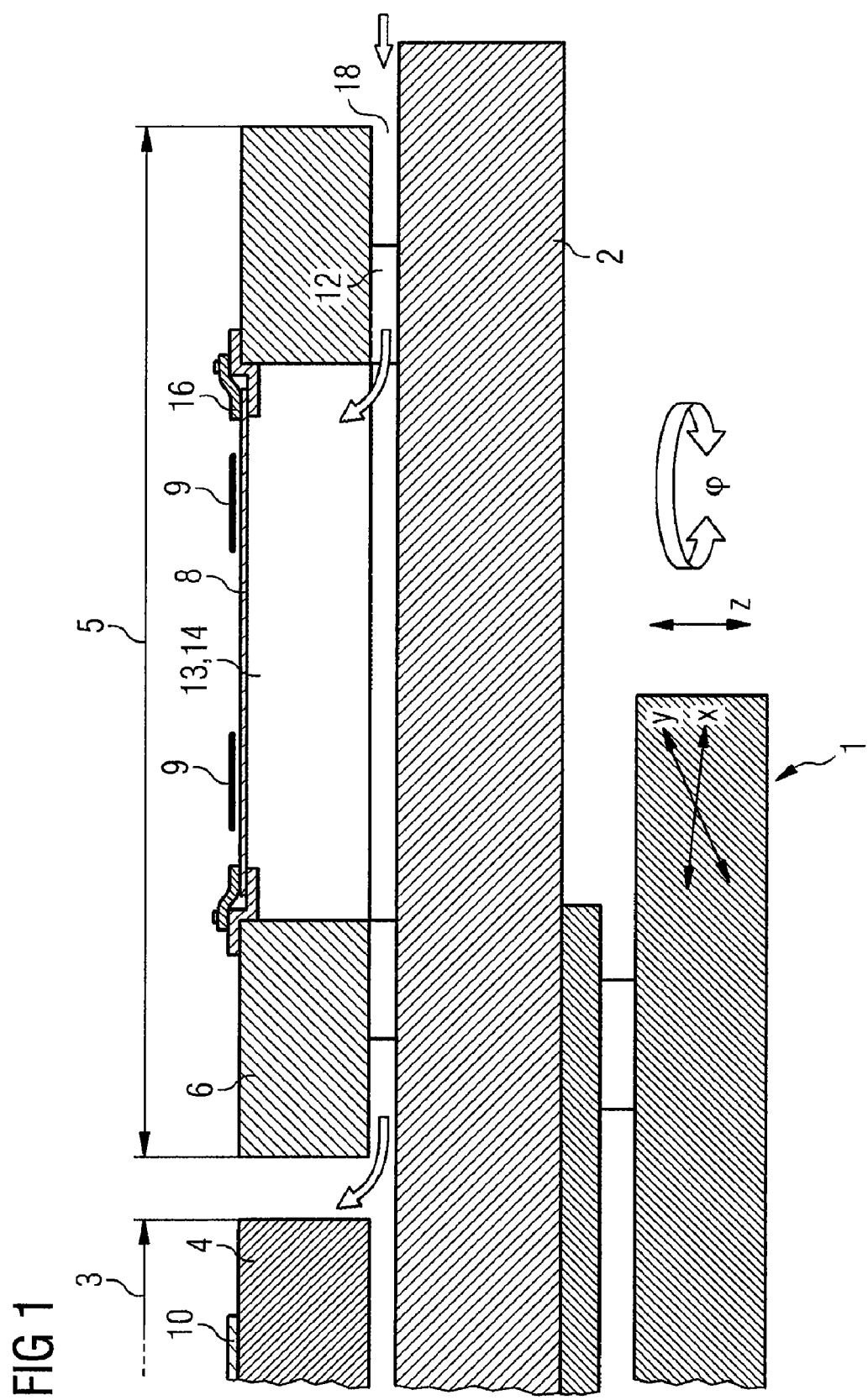
FIG. 1 shows a schematic and enlarged illustration of the part of a chuck which supports a calibration substrate, having an air chamber, which is permeated by a gaseous fluid, under the calibration substrate.

The chuck according to FIG. 1 comprises a movement apparatus 1, using which test substrate 10 and calibration substrate 8 may be moved jointly relative to probe tips (not shown) attached above the substrate, in order to perform the contacting by the probe tips. A movement of the chuck occurs, as a function of the possible movements of the probe tips, at least in the X and Y directions, frequently also additionally in the Z direction, and around a vertical rotational axis, referred to as rotational movement φ. The movement apparatus 1 moves a base plate 2, on which a first support plate 4 and, adjacent thereto, a second support plate 6 are situated. The upper terminus of the first support plate 4 forms the first support surface 3 and the upper terminus of the second support plate 6 forms the second support surface 5.

A test substrate 10 is retained on the first support surface 3 using vacuum suction, for example. The second support plate 6 retains a calibration substrate 8 on the second support surface 5. Both support plates 4, 6 comprise a metal material. Alternatively, they may also comprise a dielectric material, such as ceramic. They are implemented and situated on the base plate 2 so that the upper faces of the test substrate 10 and the calibration substrate 8 lie at the same height (Z direction). The height equalization may be implemented, for example, via height-variable spacer parts 12 below the second support plate 6, which simultaneously allow replaceability of the second support plate 6. Alternatively or additionally, the first support plate 4 may also be height-adjustable.

The second support plate 6 has a central recess 13, implemented as a passage in the exemplary embodiment shown, which forms an air chamber 14 in the second support plate 6. The calibration substrate 8 is retained using a substrate mount 16 above the upper opening of the air chamber 14, in that the substrate mount 16 encloses the calibration substrate 8 on all sides and rests on the second support plate 6 in the edge area of the recess 13. The recess 13 is slightly larger in form and area than the calibration substrate 8, so that the recess 13 is closed on top by the calibration substrate 8 and the substrate mount 16. The substrate mount 16 may be used as an adapter, in order to adapt various sizes of calibration substrates 8 to the area of the recess 13 and may also be designed so that it does not completely close the air chamber 14 on top. In a comparable way, more than one calibration substrate may also be situated using one or more substrate mounts 15 above one or more recesses 13 or a substrate mount 16 may be dispensed with entirely, if the calibration substrate 8 may rest directly on the edge area of the recess 13.

The second support plate 6 used in the illustrated exemplary embodiment ensures, because of the air chamber 14 which extends over the entire area below the calibration substrate 8, on the one hand, nearly ideal conditions for implementing and calculating a coplanar line type and simultaneously the capability of temperature control of the calibration substrate 8 by flushing underneath over the entire area using a fluid set to a defined temperature. The fluid (illustrated by arrows) is conducted into the air chamber 14 through the intermediate space 18 between the second support plate 6 and the base plate 2, washes around the entire area of the bottom side of the calibration substrate 8 and escapes back into the surroundings through the intermediate space 18. Because of this design, which is open to the environment via the intermediate space 18, temperature-controlled air or another operating gas is used as the fluid.

Alternatively, the air chamber 14 may be closed on the top and/or on the bottom and have one or more inflows and outflows for the fluid having corresponding supply and removal lines. In particular, the upper terminus ensures a good heat transfer from the fluid in the air chamber 14 to the test substrate 8. To set a uniform temperature of calibration and test substrate 8, 10, both support plates 4, 6 may also be permeated by a temperature-controlled fluid in one design.

The calibration substrate 8 is adapted in material and thickness to the test substrate 6, a silicon wafer in the exemplary embodiment. Calibration standards 9 are implemented in coplanar line technology on the calibration substrate 8, on the one hand, calibration standards 9 with transmission path (line standard) and, on the other hand, without transmission path (reflection standard). Alternatively, resistor and/or capacitor structures may also be implemented, which are used for calibration in the low-frequency range. The type, location, and number of the particular calibration standards 9 are determined by the calibration method used, as described above. A sufficiently large lateral spacing exists between a calibration standard 9 implemented on the calibration substrate 8 and the second support plate 6 by the location of the calibration standard 9 on the calibration substrate 8 and, in addition, by the retention by a substrate mount 16.

Figure 2:
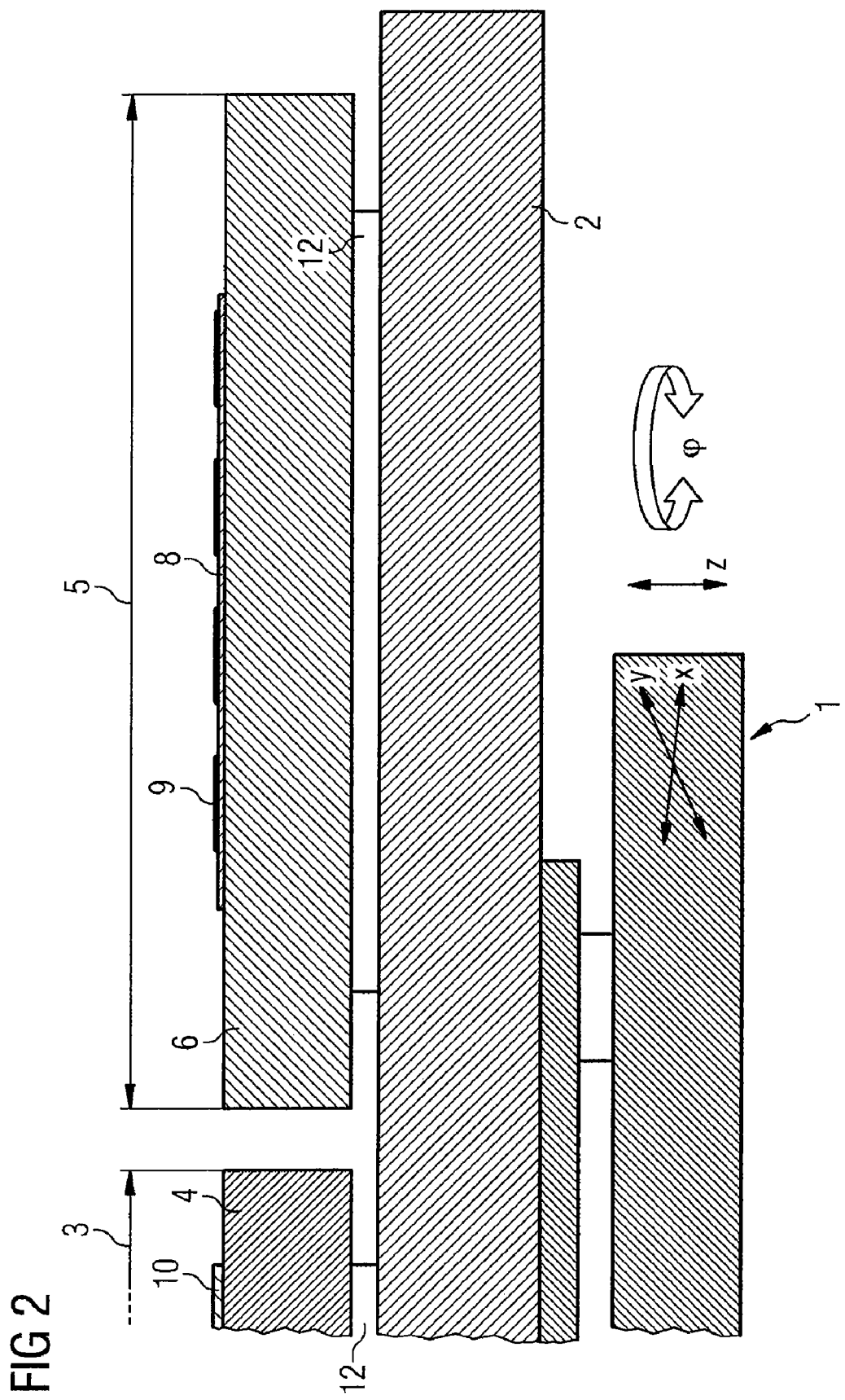
FIG. 2 shows a schematic and enlarged illustration of the second support surface of a chuck, which supports a calibration substrate and is formed by a separate support plate, which is in thermal contact with the first support plate.

The chuck in FIG. 2 has the same fundamental construction made of base plate 2 and two receptacle plates 4, 6 as that in FIG. 1, so that reference is made to FIG. 1 in regard to the corresponding design. It differs from that in FIG. 1 through a solid design of the second support plate 6 without recess. Both support plates 4, 6 are each connected via a large-area spacer part 12 to the base plate 2. The spacer parts 12 simultaneously represent a thermal connection to the base plate 2, which has a suitable temperature-control device (not shown), in order to set both support plates 4, 6 to a corresponding temperature by heating and/or cooling. Both support plates 4, 6 comprise a ceramic, whose thermal conductivity and electrical conductivity are adapted by a suitable material composition in accordance with the temperature range of the measurement and the electromagnetic requirements of the measuring configuration.

A calibration substrate 8 having multiple coplanar calibration standards 9, e.g., resistors and capacitors, is situated flatly on the second receptacle plate 6 and is also temperature-controlled via the surface contact, like the test substrate 10, which rests on the first support plate 4.

Figure 3:
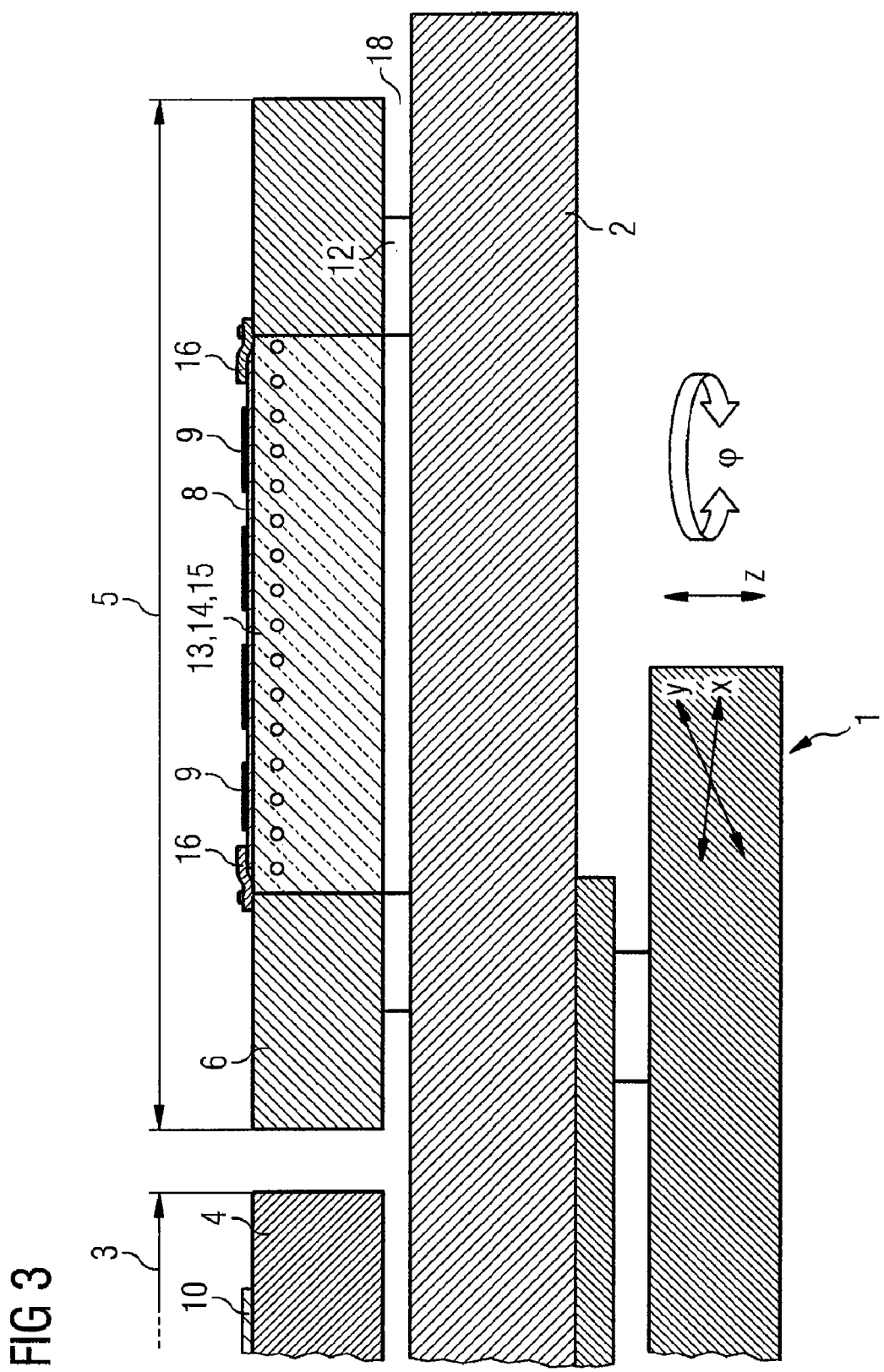
FIG. 3 shows a schematic and enlarged illustration of the part of a chuck which supports a calibration substrate, having a first support plate and a second support plate and a recess, which is filled by dielectric material, in the second support plate below the calibration substrate.

FIG. 3 illustrates a further alternative design of the second receptacle plate 6 according to FIG. 1. In contrast to FIG. 1, in FIG. 3 the recess 13 is filled with a dielectric material. In FIG. 3, the recess 13 and its inlay 15 extend over the entire thickness of the second support plate 6. The recess 14 and/or the inlay 15 may also only occupy a part of the thickness of the second support plate 6 here.

In the upper area, which faces toward the calibration substrate 8, lines 20 are embedded in the inlay 15, which are permeated by cooling or heating agent for the temperature control of the calibration substrate 8. The calibration substrate rests flatly on the inlay 15 and is fixed by a substrate mount 16. Reference is made to the above statements in regard to the further designs, which correspond to the chuck according to FIG. 1.

Figure 4:
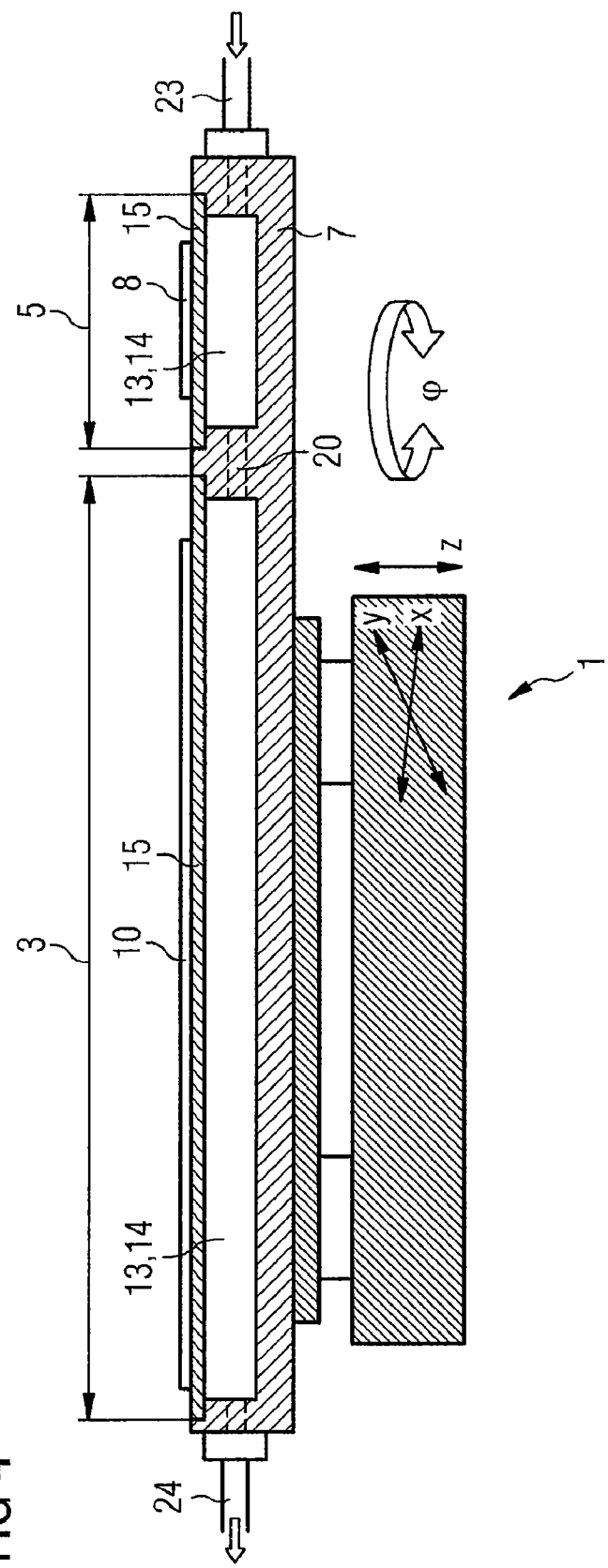
FIG. 4 shows a schematic illustration of a chuck having two support plates which close two air chambers in a main plate and form a first support surface and a second support surface.

FIG. 4 illustrates a chuck, whose first and second support surfaces 3, 5 are formed by a shared support plate 7. This plate is movable using a movement apparatus 1, in order to execute the positioning of the substrates 8, 10 to probe tips (not shown) as described for FIG. 1.

In the shared support plate 7, recesses 13, which are both covered on top by inlays 15, are introduced in the areas of a first support surface 3 and a second support surface 5. The inlays 15 have a low thickness in comparison to the shared support plate 7 and lie in a groove, so that the recesses are completely closed. The thickness of the inlays 15 is selected as a function of the strength of their material so that they securely withstand the force which is exerted on the inlays 15 upon contacting of the substrate by a plurality of probe tips (not shown). The test substrate 10 and the calibration substrate 8 are situated on the inlays 15.

The two recesses 13 below the first and the second support surfaces 3, 5 do not extend through the entire shared support plate 7, so that cavities, also air chambers 14 again here, are formed. The air chambers 14 are connected to one another by lines 22, so that a temperature-controlled fluid (shown by arrows) fed into one inflow 23 permeates both air chambers 14, thus controls the temperature of its two substrates 8, 10, and exits again through an outflow 24. Alternatively, a partition of both air chambers 14 having separate fluid flow is also possible.

Figure 5:
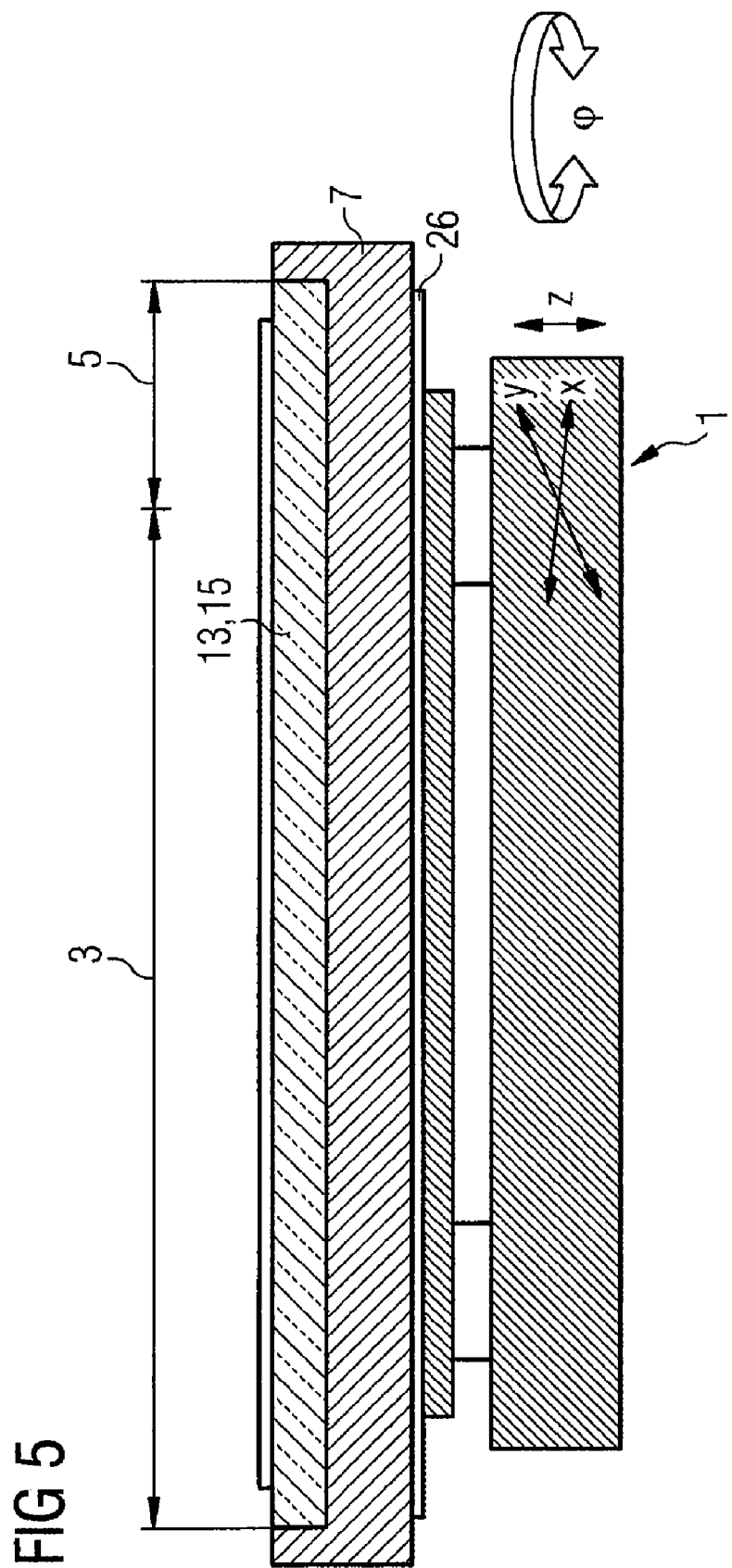
FIG. 5 shows a schematic illustration of a chuck having a shared support plate, which forms a first support surface and a second support surface and has a recess filled with dielectric material.

The chuck according to FIG. 5 also has a shared support plate 7, which is movable using a movement apparatus 1. The shared support plate 7 has a recess 13, which extends from the top of the shared support plate 7 approximately into the middle of the plate thickness, for example, and is filled with a dielectric inlay 15. A heater 26 is situated on the bottom of the shared support plate 7 to set the temperature of the shared support plate 7 and thus of test and calibration substrates 10, 8.

In the exemplary embodiment shown, the calibration standards (not shown in greater detail) are situated on the wafer, on which the electronic components to be checked are also implemented, so that the wafer is simultaneously test and calibration substrates 10, 8.

The wafer rests on the inlay 15 over its entire area, which forms first and second support surfaces 3, 5 in this design, the location of the particular support surface being defined by the position of the calibration standard and the electronic components on the wafer and being able to vary from case to case. In FIG. 5, first support surface 3 and second support surface 5 are only shown for illustration and as examples.

In the above-mentioned alternative designs of the first and/or second support plates 4, 6, instead of the described possibilities, other possibilities or even possibilities which are not described for retaining the calibration substrates 8 may be used. The substrate mount is to be designed if possible so that comparable dielectric conditions may be produced below the calibration standard for all calibration standards used for a calibration method, and in particular the material remains the same from standard to standard.

Figure 6:
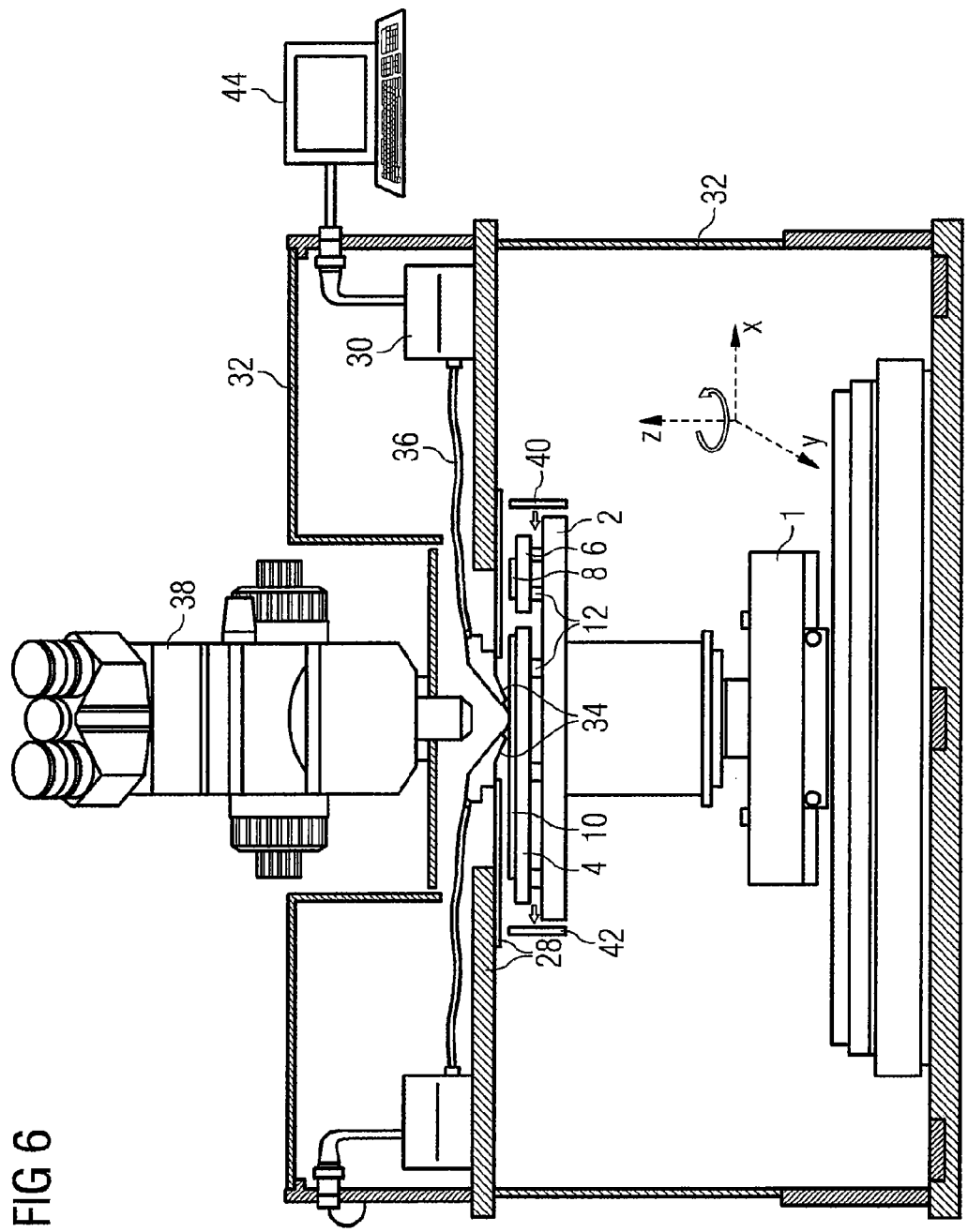
FIG. 6 shows a checking station having a chuck according to FIG. 1.

Checking a test substrate with calibration may be performed employing one of the previously described chucks in a checking station, whose fundamental construction is shown as an example in FIG. 6.

Such a checking station comprises a chuck, for example, one according to FIG. 1, which has a first support plate and a second support plate 4, 6, which are mounted on a base plate 2 and may support the test substrate 10 and a calibration substrate. Reference is made to the description of FIG. 1 on the concrete design of the chuck, identical structural components being identified using identical reference numerals.

The checking station also comprises probe tips 34, which are retained by a probe mount 28 above the support plates 4, 6 of the chuck. They are connected using a cable 36, in the exemplary embodiment via an optional signal preprocessing unit 30, to a signal unit (not shown). The probe tips are adapted to the particular measurement, in particular in their design as HF or LF probe tips. They are connected to a measuring unit 44, e.g., a network analyzer or an SMU.

In the exemplary embodiment, as the movement apparatus 1, the chuck comprises, for example, a motorized or manually driven X-Y cross table, a Z lift, and a rotation device for rotating the chuck around a rotational axis which is perpendicular to the support surface. Positioning of the substrates 8, 10 precisely below a configuration of probe tips 34 in the X-Y plane and the angular orientation of both to one another and thus a feed movement between the substrates 8, 10 and the probe tips 34 in the Z direction until the establishment of the contact are thus possible. Alternatively, at least the feed movement in the Z direction or a fine orientation to one another may also be executed by a supplementary positioning device of the probe mount 28.

A housing 32, which encloses the chuck and the substrates 8, 10 and the probe tips 34, made of an electrically conductive material, which is at ground potential, implements thermal shielding in relation to the environment, to set and stabilize the set temperatures, and EMV shielding, if needed for the relevant measurement. In connection with a special design of the base plate or the first and/or second support plates 4, 6 of the chuck, e.g., having a multilayered construction made of alternating electrically conductive and dielectric layers and the connection of targeted potentials to the conductive layers, a triaxial measuring construction may also be implemented, so that even extremely small signals or signal modulations are measurable. A technically equivalent triaxial construction is also applicable for the probe tips 20 and their mounts.

For the temperature control of the support plates 4, 6 using a fluid flow, in the exemplary embodiment, a gas supply 40 is situated laterally to the support plates in the exemplary embodiment, which is connected to a gas source, which provides the required gas mixture having the desired temperature. The gas flowing between the support plates 4, 6 and the base plate 2 and through the air chambers in both plates (not shown) is then received, conditioned, and provided again by a gas suction exhaust 42. Various pressures are also settable using a gas-tight housing 32.

The contacting of the substrates 8, 10 and the measurement are to be observed using a microscopic observation unit 38.

The invention claimed is:

1. A chuck for supporting and retaining a test substrate, the chuck having a device for supporting and retaining a calibration substrate having a planar calibration standard and the device comprising the following components:
a first support surface for supporting a test substrate,
the first support surface being temperature controlled using a temperature control device for heating and/or cooling the test substrate,
a second support surface laterally offset to the first support surface, for supporting the calibration substrate,
the second support surface being temperature controlled using a temperature control device for heating and/or cooling the calibration substrate, and
dielectric material or air being situated in the second support surface in an area below the calibration substrate at least in an area of the calibration standard.

2. The chuck according to claim 1, wherein the first and the second support surfaces are formed by a shared support plate and the second support surface comprises at least partially an upper surface of a recess, and the recess is implemented in the shared support plate in such a way that the recess extends out from an upper delimitation surface into the shared support plate.

3. The chuck according to claim 2, wherein the recess is filled with a dielectric material.

4. The chuck according to claim 2, wherein at least one of the shared or first and second support plates comprises a dielectric ceramic plate.

5. The chuck according to claim 2, wherein the temperature control device for temperature control of the second support surface comprises an air chamber in a support plate having means for permeating the air chamber through a fluid, and the air chamber is situated in an area above which the calibration substrate may be retained.

6. The chuck according to claim 5, wherein the air chamber is formed by a recess, which is open on top, and the support plate has retention means for retaining the calibration substrate above the air chamber.

7. The chuck according to claim 2, wherein both support surfaces are temperature controlled using separate temperature control devices.

8. The chuck according to claim 2, wherein both support surfaces may are temperature controlled using a shared temperature control device.

9. The chuck according to claim 1, wherein the first support surface is formed by a first support plate and the second support surface is formed by a second support plate.

10. The chuck according to claim 9, wherein the second support plate is thermally connected using a heat conductor to the first support plate.

11. The chuck according to claim 9, wherein the second support plate is situated in a recess of a support plate.

12. The chuck according to claim 9, wherein the second support plate has a recess at least in an area above which the calibration substrate may be retained.

13. The chuck according to claim 9, wherein the second support plate has a recess at least in an area above which the calibration substrate may be retained, and the recess is filled with a dielectric material at least in an upper area adjoining the second support surface.

14. The chuck according to claim 9, wherein at least one of the first and second support plates comprises a dielectric ceramic plate.

15. The chuck according to claim 9, wherein the temperature control device for temperature control of the second support surface comprises an air chamber in a support plate having means for permeating the air chamber through a fluid, and the air chamber is situated in an area above which the calibration substrate may be retained.

16. The chuck according to claim 15, wherein the air chamber is formed by a recess, which is open on top, and the support plate has retention means for retaining the calibration substrate above the air chamber.

17. The chuck according to claim 9, wherein both support surfaces are temperature controlled using separate temperature control devices.

18. The chuck according to claim 9, wherein both support surfaces are temperature controlled using a shared temperature control device.

19. A checking station for checking test substrates, comprising:
a chuck for supporting and retaining a test substrate,
probe tips for supplying test signals into the test substrate or tapping test signals from the test substrate;
a measuring unit for performing a measurement,
wherein the chuck has a device for supporting and retaining a calibration substrate having a planar calibration standard,
the device comprising the following components,
a first support surface for supporting the test substrate,
the first support surface being temperature controlled using a temperature control device for heating and/or cooling the test substrate,
a second support surface laterally offset to the first support surface, for supporting a calibration substrate,
the second support surface being temperature controlled using a temperature control device for heating and/or cooling the calibration substrate, and
dielectric material or air being situated in the second support surface in an area below the calibration substrate at least in an area of a calibration standard.

* * * * *

UNITED STATES PATENT AND TRADEMARK OFFICE
CERTIFICATE OF CORRECTION

| | | |
|---|---|---|
| PATENT NO. | : 7,999,563 B2 | Page 1 of 1 |
| APPLICATION NO. | : 12/489913 | |
| DATED | : August 16, 2011 | |
| INVENTOR(S) | : Andrej Rumiantsev et al. | |

It is certified that error appears in the above-identified patent and that said Letters Patent is hereby corrected as shown below:

On the Title page, after Item (65) Prior Publication Data, and before Item (51) Int. Cl., please insert the following:

Item --(30)        Foreign Application Priority Data

June 24, 2008  (DE) ......................................... 10 2008 029 646.5--

Column 11, Line 44, for the claim reference numeral "8", after "surfaces" please delete "may".

Signed and Sealed this
Fifteenth Day of November, 2011

David J. Kappos
*Director of the United States Patent and Trademark Office*